United States Patent
Vogtmann et al.

(10) Patent No.: US 7,345,466 B2
(45) Date of Patent: Mar. 18, 2008

(54) METHOD AND APPARATUS FOR CLEANING A PROBE CARD

(75) Inventors: Michael Vogtmann, San Ramon, CA (US); Rolf Hagenlocher, San Jose, CA (US); Uday Nayak, San Jose, CA (US)

(73) Assignee: Electroglas, Inc., San Jose, CA (US)

( * ) Notice: Subject to any disclaimer, the term of this patent is extended or adjusted under 35 U.S.C. 154(b) by 98 days.

(21) Appl. No.: 11/195,926

(22) Filed: Aug. 2, 2005

(65) Prior Publication Data

US 2007/0028946 A1 Feb. 8, 2007

(51) Int. Cl.
*G01R 31/28* (2006.01)
(52) U.S. Cl. .................................. 324/158.1
(58) Field of Classification Search ........ None
See application file for complete search history.

(56) References Cited

U.S. PATENT DOCUMENTS

| | | | | |
|---|---|---|---|---|
| 5,220,279 | A * | 6/1993 | Nagasawa | 324/754 |
| 5,647,083 | A * | 7/1997 | Sugimoto et al. | 15/77 |
| 5,778,485 | A | 7/1998 | Sano et al. | |
| 5,968,282 | A * | 10/1999 | Yamasaka | 324/754 |
| 6,118,290 | A * | 9/2000 | Sugiyama et al. | 324/754 |
| 6,418,584 | B1 * | 7/2002 | Teeny et al. | 15/102 |
| 6,651,284 | B2 * | 11/2003 | Tseng et al. | 134/186 |
| 6,817,052 | B2 * | 11/2004 | Grube | 324/754 |
| 6,870,382 | B2 * | 3/2005 | Harris | 324/758 |
| 7,151,386 | B2 * | 12/2006 | Kim | 324/754 |
| 2004/0000325 | A1 | 1/2004 | Buckholtz et al. | |
| 2004/0025911 | A1 * | 2/2004 | Yeo et al. | 134/186 |
| 2005/0012515 | A1 | 1/2005 | Kim | |
| 2006/0001438 | A1 * | 1/2006 | Humphrey et al. | 324/754 |

OTHER PUBLICATIONS

PCT International Search Report and Written Opinion PCT Appln. No. PCT/US2006/030013, mailed Jan. 17, 2007, 14 pages.

* cited by examiner

*Primary Examiner*—Jermele Hollington
(74) *Attorney, Agent, or Firm*—Blakely, Sokoloff, Taylor & Zafman LLP (57) ABSTRACT

A cleaning device for use in a semiconductor processing. The device comprises a substrate supporter for supporting a substrate to be cleaned, a scrub pad mounting plate, and a chuck coupling to the substrate supporter and the scrub pad mounting plate. The chuck is configured to move the substrate supporter and the scrub pad mounting plate. The device further comprises a scrub pad mountable to and moveable from the scrub pad mounting plate. The scrub pad, when mounted to the scrub pad mounting plate, is higher than the substrate when mounted on the substrate supporter. The scrub pad mounting plate and the substrate supporter can both be coupled to the chuck so that the chuck moves both the scrub pad mounting plate and the substrate supporter in one action.

14 Claims, 7 Drawing Sheets

METHOD AND APPARATUS FOR CLEANING A PROBE CARD

FIELD

The present invention relates generally to semiconductor processing and more particularly to a probe card system and cleaning a probe card that is used to test semiconductor devices formed on a substrate such as a wafer.

BACKGROUND

Integrated circuits are often manufactured on a semiconductor substrate, such as a silicon wafer. The silicon wafer is typically a thin circular plate of silicon that is 150 or 200 millimeters in diameter and approximately 25 mils thick. A single wafer will have numerous devices which are integrated circuits and are imprinted on the wafer comprising a lattice of devices. Each device consists of numerous layers of circuitry and a collection of bonding pads. The bonding pads are small sites, typically 3 mils square, made usually with aluminum (or other conductive material) that eventually serve as the device's connections to the pin leads. Other than the bonding pads, the remainder of the wafer is coated with a final layer of an insulating material such as silicon nitride, called the passivation layer, which in many respects behaves like glass. The aluminum itself forms a thin non-conductive layer of aluminum oxide, which must be eliminated or broken through before good electrical contact can be made.

Since the packaging of a device is somewhat expensive, it is desirable to test a device before packaging to avoid packaging bad devices. This process of testing devices before packaging is referred to as the sort process. This process involves connecting a device called a probe card to a special tester. The probe card has a collection of electrical contacts or pins (also referred to as probe elements) that stands in for the normal pins and wire leads of a packaged device. The wafer is then positioned so that the contacts or pins on the probe card make contact with a given device's bonding pads and the tester runs a battery of electrical tests on the device. A special machine, called a wafer prober, is used to position each device on the wafer with respect to the probe card. High accuracy is required, because the bonding pads are small and if a probe card pin makes contact outside the bonding pad area, the result may be a break in the passivation layer, which generally results in a damaged device. Also, the card pins need to be cleaned to ensure accuracy of such contact.

In addition to establishing the contact for the testing, the tips or pins of the probe cards may also perform a scrubbing action in which the tip of the probe card moves horizontally as it contacts the bonding pad in order to scrub away oxide, or any other material on the pad, that may inhibit the electrical contact between the probes and the bonding pads. Although the scrubbing action improves the electrical contact between the probe tip and the bonding pad, it unfortunately also generates some debris (the scraped up oxide or other debris) that may also prevent the probe tip from making a good electrical contact with the bonding pad. Alternatively, the probe tip may press vertically into the bonding pad, solder or gold bump with sufficient force to penetrate any surface material and establish good electrical contact. The probe tip may become contaminated with contaminates such as aluminum, copper, lead, tin or gold.

Typically, the debris generated by probe elements needs to be periodically removed from the probe elements to prevent a build-up which causes increased contact resistance, continuity failures and false test indications, which in turn results in artificially lower yields and subsequent increased product costs. Typically, the entire probe card with the plurality of probes must be removed from the prober and cleaned or abrasively cleaned in the prober. In a typical prober, the probe card is cleaned as often as several times an hour.

Currently, the method for cleaning the probe card is to remove it from the prober and manually clean the debris from the probe tips. The probe tips need to be cleaned to remove debris from them since the debris reduces the quality of the electrical circuit completed by the contact of the probe tips to any surfaces on a die. The completed electrical circuit is used to evaluate the electrical characteristics of the die by the test apparatus. The degradation of the quality of the electrical circuit caused by the probe tip debris may be interpreted by the test apparatus as a failure of the die under test even though the die is functioning correctly. This false failure of the die results in the rejection or the rework of good die thereby increasing the cost of the final products sold.

Currently, the probe tips can be cleaned using an abrasive pad or a scrub pad. The debris can also be removed manually by means of alcohol and a cotton tip swab or an air gun. Contaminates, such as lead and tin, may be removed by abrasive cleaning/burnishing or cleaning the probes with a solution that may typically be an acid for example. Most methods can clean the probe tips but requires stopping the prober and a person to perform the cleaning function.

It is desirable to provide a probe card cleaning device and method which overcomes the above limitations and drawbacks of the conventional cleaning devices and methods so that the probe cards may be cleaned more rapidly and effectively. The cleaning device and method may also be used with other devices.

SUMMARY

Embodiments of the present invention provide improved methods and apparatuses for cleaning and replacing a probe card in a wafer prober.

In one aspect, the invention pertains to a cleaning device for use in a semiconductor processing. The device comprises a substrate supporter for supporting a substrate to be cleaned, a scrub pad mounting plate, and a chuck coupling to the substrate supporter and the scrub pad mounting plate. The chuck is configured to move the substrate supporter and the scrub pad mounting plate. The device further comprises a scrub pad mountable to and moveable from the scrub pad mounting plate. The scrub pad, when mounted to the scrub pad mounting plate, is higher than the substrate when mounted on the substrate supporter. For instance, the scrub pad has a thickness or height predetermined such that when it is placed on the scrub pad mounting plate, the scrub pad is higher relative to the substrate. The scrub pad mounting plate and the substrate supporter can both be coupled to the chuck so that the chuck moves both the scrub pad mounting plate and the substrate supporter in one action.

In another aspect, the invention pertains to a method which comprises placing a scrub pad on a scrub pad mounting plate with the scrub pad mounting plate being coupled to a chuck which is further coupled to a substrate supporter for supporting a substrate. The chuck is also configured to move the substrate supporter and the scrub pad mounting plate. When the scrub pad is placed on the scrub pad mounting plate, the scrub pad is higher than a substrate placed on the substrate supporter. For instance, the scrub pad has a thickness or height predetermined such that when it is placed on the scrub pad mounting plate, the scrub pad is higher relative to the substrate. The method further comprises positioning the scrub pad with respect to a probe card, which has at least one probe element to be cleaned, and cleaning such probe element. In addition, the method may comprise receiving a signal to stop cleaning the probe element and then moving the scrub pad away from the probe card. In addition, the method may also comprise moving the scrub pad mounting plate to a load/unload station and unloading the scrub pad at the load/unload station after a cleaning cycle. In addition, the method may also comprise loading another scrub pad having at least one probe element onto the scrub pad mounting plate for another cleaning cycle. In addition, the method may also comprise analyzing at least one characteristic of the scrub pad or other scrub pads stored at the load/unload station prior to loading them on the scrub pad mounting plate. In addition, the method may also comprise programming or modifying at least one parameter for a cleaning cycle for the probe card based on the analysis.

In another aspect, the invention pertains to a method which comprises placing a substrate on a substrate supporter provided in a cleaning chamber, placing a scrub pad on a scrub pad mounting plate provided in the cleaning chamber, and providing a probe card having at least one probe element configured to perform a testing procedure on the substrate. The scrub pad mounting plate and the substrate supporter are coupled to a chuck provided in the cleaning chamber, wherein the chuck is configured to move the substrate supporter and the scrub pad mounting plate. The scrub pad mounting plate and the substrate supporter can be coupled to one another so that the chuck can move both in one action. When the scrub pad is placed on the scrub pad mounting plate, the scrub pad is higher than a substrate placed on the substrate supporter. For instance, the scrub pad has a thickness or height predetermined such that when it is placed on the scrub pad mounting plate, the scrub pad is higher relative to the substrate. In addition, the method may also comprise loading the scrub pad onto the scrub pad mounting plate from a load/unload station configured to store the scrub pad for the step of placing the scrub pad on the scrub pad mounting plate. In addition, the method may also comprise moving the scrub pad mounting plate over to the load/unload station for loading of the scrub pad onto the scrub pad mounting plate. Alternatively, the method comprises moving the load/unload station to the scrub pad mounting plate for loading of the scrub pad onto the scrub pad mounting plate. In addition, the method may also comprise positioning the substrate with respect to the probe card and performing a testing procedure for devices formed in or on the substrate using the probe card. In addition, the method may also comprise receiving a signal to stop the testing procedure, receiving signal for cleaning the at least one probe element, positioning the scrub pad with respect to the probe card for the cleaning of the at least one probe element, and cleaning at least one probe element using the scrub pad. In addition, the method may also comprise receiving a signal to stop cleaning the at least one probe element and moving the scrub pad away from the probe card. In addition, the method may also comprise moving the scrub pad mounting plate to a load/unload station and unloading the scrub pad at the load/unload station. In addition, the method may also comprise loading another scrub pad having at least one probe element onto the scrub pad mounting plate. In addition, the method also comprises analyzing at least one characteristic of the scrub pad at the load/unload station and programming or modifying at least one parameter for a cleaning cycle for cleaning the at least one probe element based on the analyzing.

Any of these exemplary methods can be performed via a command processed by a controller from a computer or a programmable machine. For instance, a processing unit can be coupled to the chamber cleaning chamber and that the processing unit is configured to be able to execute a set of instructions that carry out the particular steps of the methods. When the term cleaning is used, it may includes at least one of scrubbing, cleaning, servicing, maintaining, reshaping, sharpening, and modifying the probe element.

BRIEF DESCRIPTION OF THE DRAWINGS

The invention will be understood more fully from the detailed description given below and from the accompanying drawings of various embodiments of the invention, which, however, should not be taken to limit the invention to the specific embodiments, but are for explanation and understanding only. In the drawings.

DETAILED DESCRIPTION

In the following description, for purposes of explanation, numerous specific details are set forth in order to provide a thorough understanding of the invention. It will be apparent to one skilled in the art, however, that the invention can be practiced without these specific details. In other instances, structures and devices are shown in block diagram form to avoid obscuring the invention.

Figure 1:
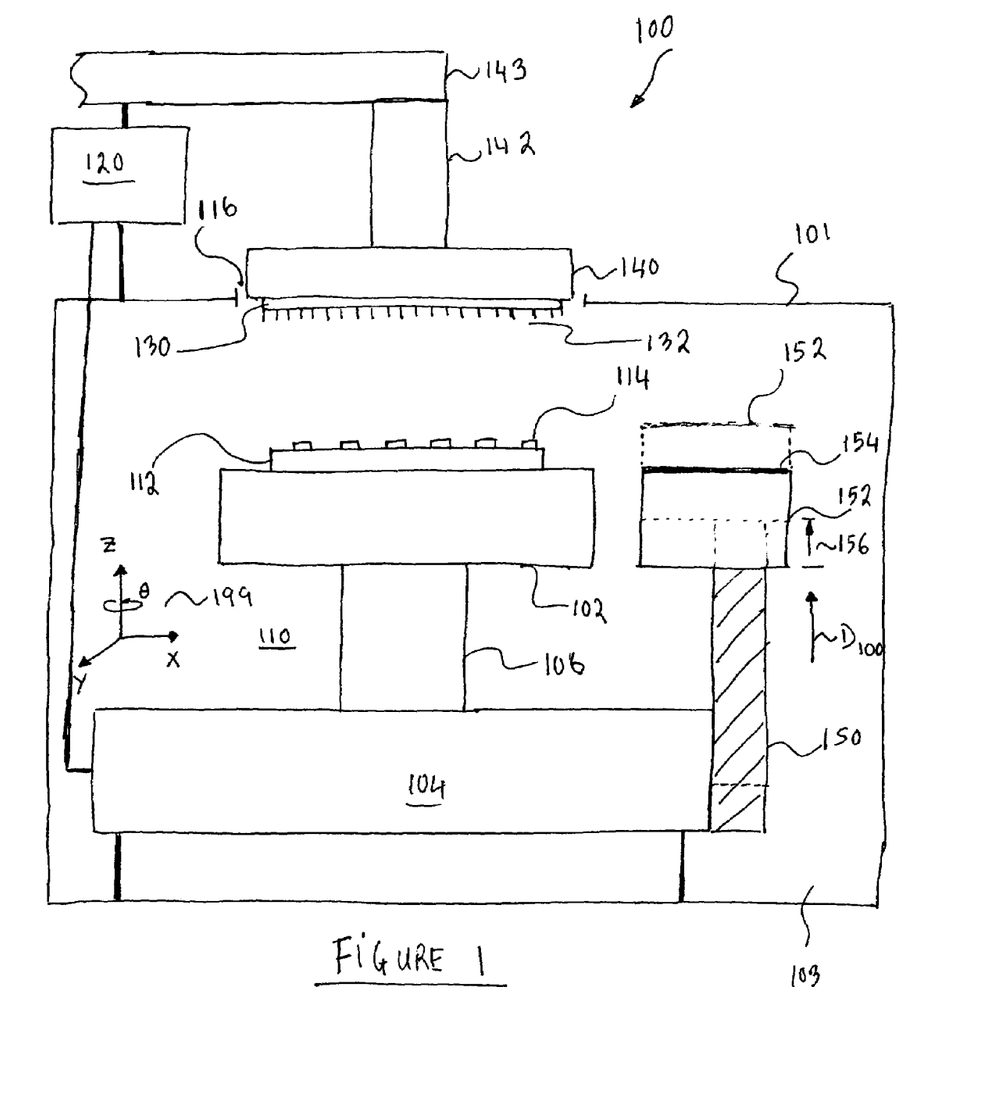
FIG. 1 illustrates an example wafer prober system that requires moving the scrub pad up and down.

FIG. 1 of the accompanying drawings illustrates a probe apparatus 100, according to an embodiment of the present invention, for electrical testing of a substrate (e.g., a silicon wafer) having a plurality of terminals. The apparatus 100 includes a frame 101, a probe card 130, a substrate holder 102, a scrub device 152, and a translation device 110.

The frame 101 includes an opening 116 through which the probe card 130 is introduced into the frame 101. The frame 101 also can define a testing and cleaning chamber 103 for the apparatus 100. The chamber 103 can be set to a suitable condition (e.g., suitable temperature and pressure) for the testing and cleaning a wafer.

The probe card 130 is mounted to a probe card support structure 140, which is further mounted or extended from a probe card chuck 142. The chuck 142 actuates, manipulates, positions, or controls the position of the probe card 130. The chuck 142 can be connected to an arm 143 that is coupled to or is part of a motor that is used to move, actuate, manipulate, position, or align the probe card 130. The probe chuck 142 may be configured to provide movement of the probe card 130 in any of the X, Y, Z, or theta directions 199. In addition, the movement of the probe card 130 can also be control by a processing unit or a controller 120 coupled to the apparatus 100. The controller 120 is typically a computer having a processor (not shown) that can execute a program (a set of instructions) that controls all of the components of and steps associated with the apparatus 100. In one embodiment, a computer program product is stored in a machine-readable medium that is coupled to the controller 120 and is executed by the processor. In this embodiment, the program controls the testing cycle, cleaning cycle, and other steps associated with the apparatus 100. User interactive devices such as keyboard, mouse, and display can also be coupled to the controller 120 to allow for controlling of the apparatus 100.

The probe card 130 includes a plurality of probe elements, pins, or bars 132 extending from the bottom surface of the probe card 130. The elements 132 are contact electrodes which may include metallic pins. The probe elements 132 are also secured to the probe card 130. The probe card 130 is used for making electrical contact with the terminals on a substrate. The probe elements 132 are brought into contact with the terminals. An electrical tester (not shown) is connected to the probe elements 132 and the probe card 130. Electrical signals can be transmitted from the electrical tester thorough the probe elements and the terminals to the electrical circuits, or signals can be sent from the circuits through the terminals and probe elements to the electrical tester. The probe card 130 may be any of the different varieties of probe cards, including for example membrane probe cards.

The substrate holder 102 is mounted or supported by a wafer chuck 106 which is further coupled to a base 104. In one embodiment, the base 104 is located on a horizontal surface of the frame 103. The base 104 is configured to translate a force to the wafer chuck 106 to allow it to move in a vertical and/or horizontal direction. In one embodiment, wafer chuck 106 is moveably coupled to the base 104 in a manner which allows the wafer chuck 106 to be moved in the X, Y, Z, and theta directions 199. The base 104 can include a motor or an actuation mechanism (known in the art) to move the wafer chuck in such directions.

The wafer chuck 106 also accepts the attachment of a substrate 112 via the substrate support 102. The substrate 112 is a semiconductor wafer having one or more electrical components (not shown) built or formed thereon or therein. Contact pads 114 are provided on the substrate 112 for a testing purpose, in one embodiment.

The wafer chuck 106 and the base 104 can also be coupled to the controller 120 similar to previously described for the probe card support structure 140 and the probe card chuck 142. In addition, the movement of the wafer chuck 106, the base 104, as well as the substrate support 102 can also be controlled by the controller 120 coupled to the apparatus 100.

For a testing cycle, the probe card 130 is brought into contact with the substrate 112 such that the probe elements 132 make contact with the contact pads 114 on the substrate so that a particular electrical testing can take place. For instance, the elements 132 make contact with the pads 114 of the substrate 112 when the probe card 130 and the substrate are properly aligned by the apparatus 100, for example, via the assistance of an operator and/or the controller 120. The pads 114 may comprise any contact electrode surface including, but not limited to a flat surface or a solder bump or pins or posts. The alignment can also be accomplished using a vision subsystem (not shown) incorporated into the apparatus 100 and positioned in the chamber 103. The vision subsystem of the apparatus 100 of the present embodiment may use two cameras, a wafer alignment camera (not shown) and a sensor camera (not shown). The wafer alignment camera, which may contain both coaxial and oblique illumination sources, is configured to view a substrate 112 on the wafer chuck 102. The vision subsystem is also configured to view a probe card 130 attached to the probe chuck 140.

While the system shown in FIG. 1 probes the wafer horizontally, it will be appreciated that the various aspects of the present invention may be used with vertical prober system in which the flat surface of the wafer is rotated 90-degree from the position shown in FIG. 1. Also, although the apparatus 100 shown in this figure illustrates only one probe card 130 and one substrate 112, it is to be understood that the apparatus 100 may very well include more than one of such components.

After a certain testing cycles, the probe elements 132 may need to be cleaned or otherwise treated. A scrub device 152 is provided for such cleaning or treating purpose. In the present embodiment, the scrub device 152 is included within the chamber 103. In one embodiment, the scrub device 152 is placed on scrub supporter 150 can moved in the X, Y, and Z direction 199. The scrub device 152 includes a scrub substrate or pad 154 placed on top of the scrub device 152. In one embodiment, the scrub supporter 150 is moved by the base 104 similar to how the wafer chuck 106 is moved.

In one embodiment, to clean or treat the probe elements 132, the base 104 moves the scrub supporter 150 to align it with the probe card 130. For example, the base 104 moves the wafer chuck 106 horizontally away from the probe card 130 and moves and aligns the scrub device 152 with respect to (e.g., below) the probe card 130. Then, the base 104 moves the scrub supporter 150 vertically upward in the $D_{100}$ direction to bring the scrub pad 154 to a higher position than the substrate 112. In one embodiment, the scrub device 152 is raised a distance 156 so as to place the scrub device 152 to be higher than the substrate 112. In one embodiment, a motor (not shown) is coupled to the scrub device 152 to move the scrub device 152 in the vertical direction (Z direction) so that the scrub pad 154 can be brought closer to the probe elements 132. The motor can also be configured to be able to rotate the scrub device 152 for a particular cleaning process. Alternatively, the motor that is used to control the probe card 130 can also be configured to rotate the probe card 130 for similar cleaning processes.

The scrub pad 154 can be made of various materials that can clean a probe element 132 of a probe card 130. In cleaning the probe element 132, the scrub pad 154 can scrub, clean, maintain, reshape, sharpen, or even modify the probe element 132 depending on a desired cleaning process. The scrub pad 154 is made of a material or materials with predetermined characteristics, which clean debris or residues from the probe element 132, which maintains or modifies the shape of the probe element 132 when the probe element 132 contacts or penetrates into or through the scrub pad 154. The scrub pad 154 may also have a predetermined mechanical or chemical characteristic such as abrasiveness, density, elasticity, tackiness, planarity, chemical properties (acetic or basic). The chosen characteristic is such that when the probe element 132 contacts or penetrates the scrub pad 154 and optionally rotates with respect to the scrub pad 154, the probe element 132 is cleaned, treated, or modified, or that the debris, contaminants, or residues are removed from the probe element 132. Additionally, the predetermined characteristic is chosen such that the probe element 132 can penetrate into or through the scrub pad for cleaning without causing damages or unwanted modification to the probe element 132.

Figure 3:
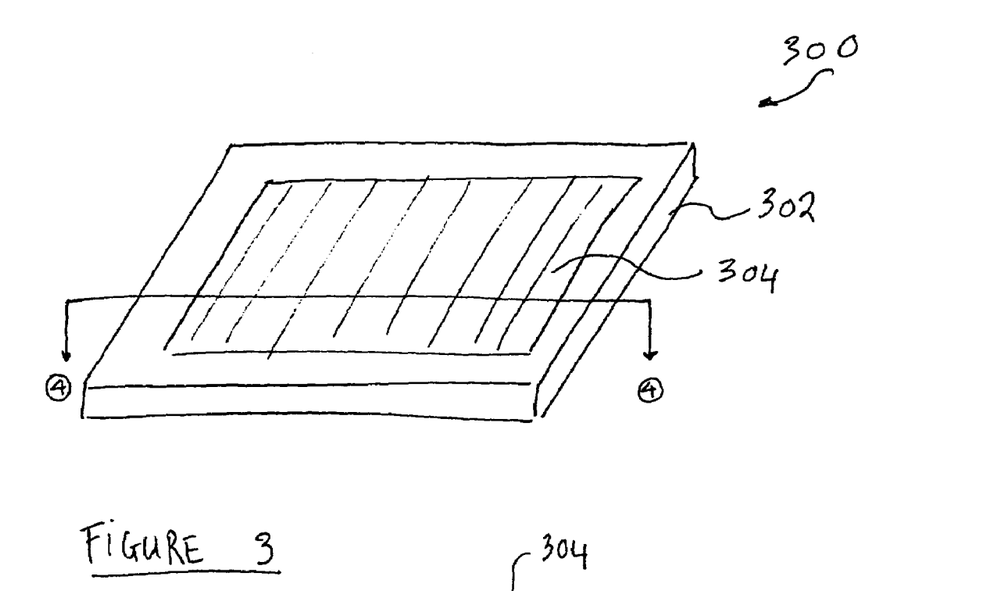
FIGS. 3-4 illustrate exemplary embodiment of a scrub pad that can be used with various embodiments of the present invention.
Figure 4:
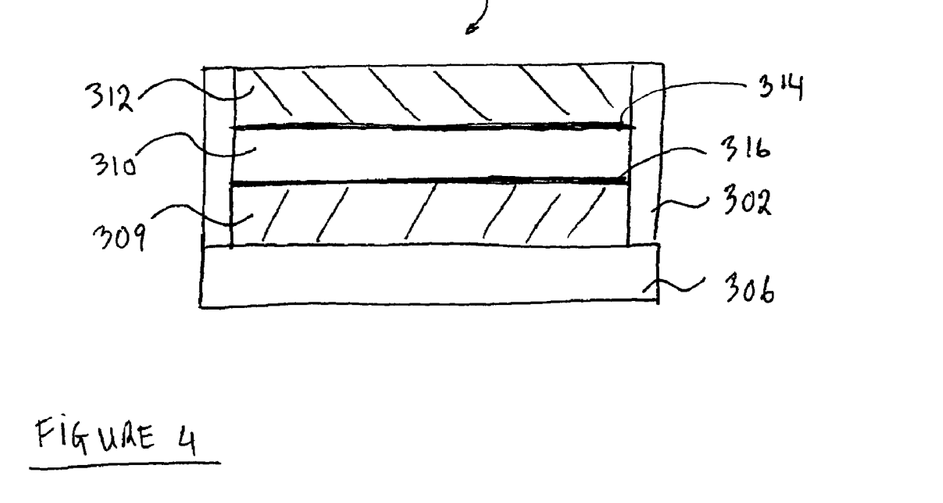

In one embodiment, the scrub pad 154 includes a chemical layer or layers or a get-like material for a particular cleaning process. For example, the scrub pad 154 includes a well that includes a chemical layer for a cleaning process. FIGS. 3-4 illustrate an exemplary scrub pad 300 that can be used for the scrub pad 154. In the present embodiment, the scrub pad 300 includes a frame 302 that surrounds a cleaning stack 304. The cleaning stack 304 includes one or more chemical layers or cells that may be acetic or basis which can oxidize, reduce, or clean contaminants, or which can induce a chemical reaction and/or a mechanical action that removes contaminants. FIG. 4 illustrates an exemplary cleaning stack 304 in more detail. The stack 304 includes a substrate 306, a layer 310 disposed on the layer 309, and a layer 312 disposed on the layer 310. Between each layer, there may be a seal layer 314 and 316. Each of the layers 309, 310, and 312 may be a chemical layer having a particular characteristic for a particular cleaning. The stack 304 may include a combination of layer that performs both chemical and mechanical cleaning for a probe element.

The scrub pad 300 can include materials such as tungsten, ceramic, aluminum, stainless steel, gel pad, sand paper, etc.

In instances when the scrub device needs to be moved in a direction such as to be raised up vertically to be closer to the probe card, the platform that supports and actuates the scrub device may experience a deflection force that may cause damages or deformation to the scrub device or the probe elements. Also, it may be difficult to obtain a repeatable height, repeatable vertical height, repeatable planarity and/or repeatable actuation for the scrub device. Also, in cleaning the probe card's probe elements, the elements may exert a high force onto the scrub device and as such, it is difficult to maintain alignment.

Non-repeatability in movements of the scrub device may cause unnecessary damages or deformation to the probe card and/or the probe elements. Moreover, a more complex actuation mechanism may be needed in addition to the mechanism that is used to move the substrate supporter. For instance, the mechanism that is used to move the substrate supporter may need an additional actuation mechanism that can independently raise or move the scrub device closer to the probe card for cleaning. In many instances, the scrub device needs to be moved closer to the probe card than the substrate to the probe card. Thus, two different or independent mechanisms may be necessary.

Figure 2:
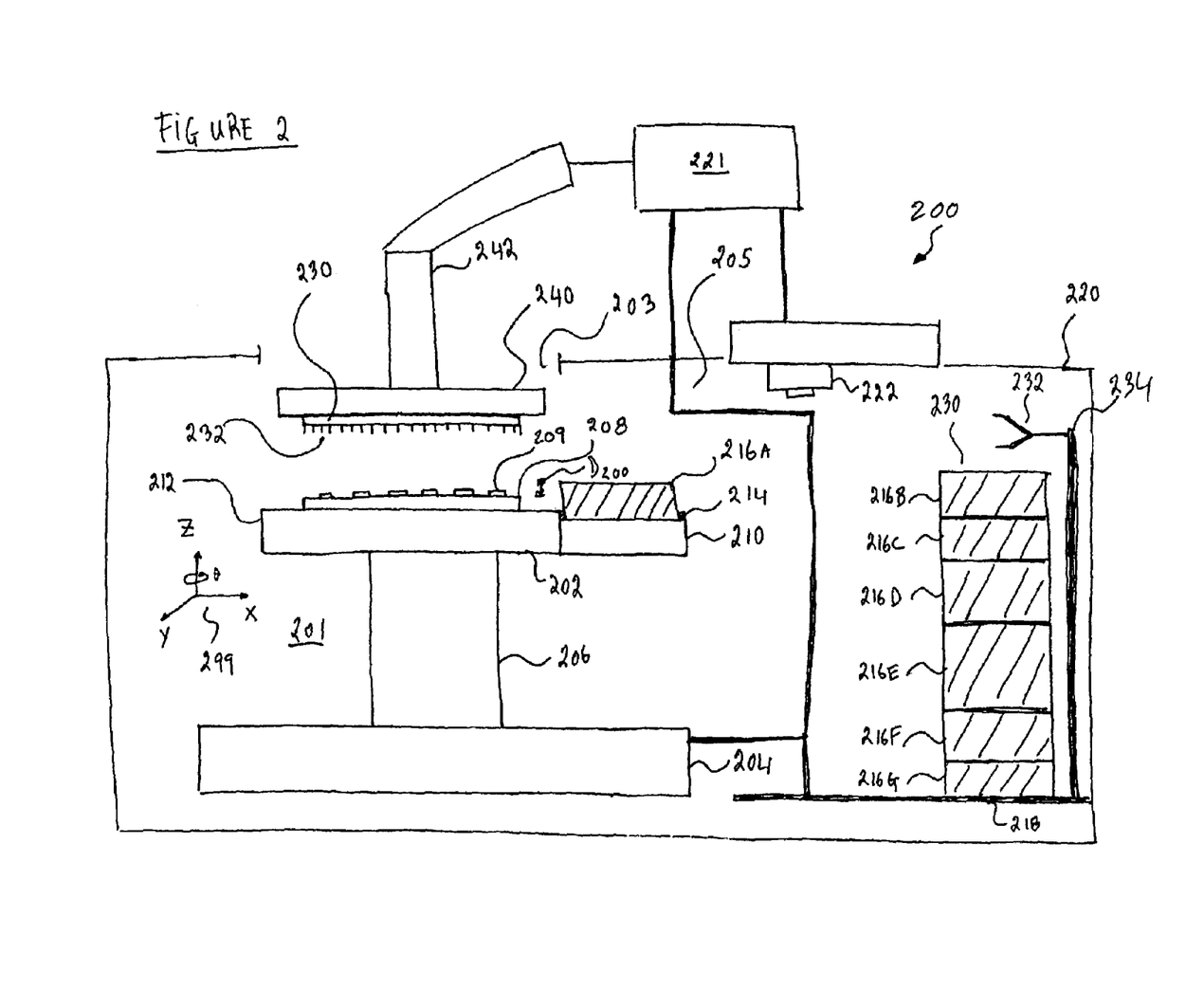
FIG. 2 illustrates an exemplary embodiment of a wafer prober in according to embodiments of the present invention.

FIG. 2 illustrates an exemplary embodiment of a probe apparatus 200 in according to the present invention. The apparatus 200 solves a problem of separate and independent actuation mechanism to move a scrub device to be in alignment and sufficiently close to a probe card. The apparatus 200 utilizes the same mechanism that is used to move the substrate in alignment with the probe card for testing to move a scrub device in alignment with the probe card for cleaning the probe elements. In this configuration, no additional mechanism is needed for the apparatus to move the scrub device.

The apparatus 200 includes a frame 220, a probe card 230, a substrate holder or supporter 202, a scrub pad mounting plate/platform 210, and a translation device 201.

The frame 220 includes an opening 203 through which the probe card 230 is introduced into the chamber 205 of the apparatus 200. As before, the chamber 205 can be set to a suitable condition for a testing and a cleaning cycle for a wafer.

The probe card 230 is mounted to a probe card support structure 240, which is further mounted or extended from a probe card chuck 242. The chuck 242 actuates, manipulates, positions, or controls the position of the probe card 230. The chuck 242 can be connected to an arm that is coupled to or is part of a motor that is used to move, actuate, manipulate, position, or align the probe card 230. The probe chuck 242 may be configured to provide movement of the probe card 230 in any of the X, Y, Z, or theta directions 299. In addition, the movement of the probe card 230 can also be controlled by a processing unit or a controller 221 coupled to the apparatus 100. The controller 120 is typically a computer having a processor (not shown) that can execute a program (a set of instructions) that controls all of the components of and steps associated with the apparatus 100. In one embodiment, a computer program product is stored in a machine-readable medium that is coupled to the controller 221 and is executed by the processor. In this embodiment, the program controls the testing cycle, cleaning cycle, and other steps associated with the apparatus 100. User interactive devices such as keyboard, mouse, and display can also be coupled to the controller 221 to allow for controlling of the apparatus 200.

The probe card 230 includes a plurality of probe elements, pins, or bars 232 extending from the bottom surface of the probe card 230. The elements 232 are contact electrodes which may include metallic pins. The probe elements 232 are also secured to the probe card 230. The probe card 230 is used for making electrical contact with the terminals on a substrate. The probe elements 232 are brought into contact with the terminals. An electrical tester (not shown) is connected to the probe elements 232 and the probe card 230. Electrical signals can be transmitted from the electrical tester thorough the probe elements and the terminals to the electrical circuits, or signals can be sent from the circuits through the terminals and probe elements to the electrical tester. The probe card 230 may be any of the different varieties of probe cards, including for example membrane probe cards.

The substrate holder 212 is controlled by the translational device 201. In one embodiment, the substrate holder 212 is mounted to a platform 202 which is further supported by a wafer chuck 206 which is further coupled to a base 204. In one embodiment, the base 204 is located on a horizontal surface of the frame 220. The base 204 is configured to translate a force to the wafer chuck 206 to allow it to move in a vertical and/or horizontal direction. In one embodiment, wafer chuck 206 is moveably coupled to the base 204 in a manner which allows the wafer chuck 206 to be moved in the X, Y, Z, and theta directions 299. The base 204 can include a motor or an actuation mechanism (known in the art) to move the wafer chuck in such directions. Moving of the wafer chuck 206 translates respective movement to the platform 202 and the substrate holder 212.

The wafer chuck 206 also accepts the attachment of a substrate 208 via the substrate support 212. The substrate 208 is a semiconductor wafer having one or more electrical components (not shown) built or formed thereon or therein. Contact pads 209 are provided on the substrate 208 for a testing purpose, in one embodiment.

The wafer chuck 206 and the base 204 can also be coupled to the controller 221 similar to previously described for the probe card support structure 240 and the probe card chuck 242. In addition, the movement of the wafer chuck 206, the base 204, the platform 202, as well as the substrate support 202 can also be controlled by the controller 220 coupled to the apparatus 200.

For a testing cycle, the probe card 230 is brought into contact with the substrate 208 such that the probe elements 232 make contact with the contact pads 209 on the substrate 208 so that a particular electrical testing can take place. For instance, the elements 232 make contact with the pads 209 of the substrate 208 when the probe card 230 and the substrate 208 are properly aligned by the apparatus 200, for example, via the assistance of an operator and/or the controller 221. The pads 209 may comprise any contact electrode surface including, but not limited to a flat surface or a solder bump or pins or posts. The alignment can also be accomplished using a vision subsystem (not shown) incorporated into the apparatus 200 and positioned in the chamber 220. The vision subsystem of the apparatus 200 of the present embodiment may use two cameras, a wafer alignment camera (not shown) and a sensor camera (not shown). The wafer alignment camera, which may contain both coaxial and oblique illumination sources, is configured to view a substrate 208 on the substrate supporter 212. The vision subsystem is also configured to view a probe card 230 attached to the probe chuck 240.

The scrub pad mounting plate 210 is also controlled by the translational device 201. The scrub pad mounting plate 210 is mounted on the platform 202. In one embodiment, the scrub pad mounting plate 210 is coupled to the wafer chuck 206 (via the platform 202) so that the chuck 206 can move the scrub pad mounting plate 210 in the same way that the wafer chuck 206 moves the substrate supporter 212. In one embodiment, the scrub pad mounting plate 210 is attached to and adjacent to the substrate supporter 212. Thus, the same action that is used to move the substrate supporter 212 is used to move the scrub pad mounting plate 210. In the present embodiment, only one actuation mechanism is used to move both the substrate supporter 212 and the scrub pad mounting plate 210.

The scrub pad mounting plate 210 includes one or more coupling member or mounting member 214 for securing a scrub pad 216A to the scrub pad mounting plate 210. The mounting member 214 can have the form of a track where complimentary track on the scrub pad 216A can mount to and be secured thereto.

The scrub pad 216A and the scrub pad mounting plate 210 are dimensioned so that when the scrub pad 216A is mounted onto the scrub pad mounting plate 210, the scrub pad 216A is higher than the substrate 208 that is loaded on the substrate supporter 212. When mounted, the scrub pad 216A is at a distance D200 that is higher than the substrate 208 that is mounted on the substrate supporter 212. The wafer chuck 206 moves both the scrub pad mounting plate 210 and the scrub pad 216A using the same mechanism but with the scrub pad 216A being dimensioned to be sufficiently thick, when loaded, the scrub pad 216A is higher than the substrate 208. Thus, the same mechanism is used to raise the substrate supporter 212 and the scrub pad mounting plate 210 at the same time but with the scrub pad 216A ends up being higher than the substrate due to its thickness and dimension. The scrub pad 216A thus can be brought closer to the probe card for cleaning the probe elements without an additional actuation mechanism.

In one embodiment, the scrub pad mounting plate 210 is configured to allow loading/unloading of a new scrub pad. In one embodiment, the apparatus 200 includes a loading/unloading station 230 that holds one or more scrub pads 216A-216G. The station 230 can be a cassette system configured to store a plurality of scrub pads. The station 230 can also be a docking station with compartments or slots configured to hold a plurality of scrub pads. The loading/unloading station 230 can also be configured to load a scrub pad onto the scrub pad mounting plate 210. In one embodiment, the loading/unloading station 230 removes one scrub pad from the scrub pad mounting plate 210 and places another scrub pad onto the scrub pad mounting plate 210 (e.g., replacing a used scrub pad with a new scrub pad).

In one embodiment, the loading/unloading station 230 is configured to store a set of scrub pad 216A-216G of multiple scrub pad materials of same types of different types. A used scrub pad can be replaced by an unused pad at the loading/unloading station. The apparatus 200 can also load a different scrub pad depending on a particular cleaning process without shutting down the apparatus 200 for the replacement. In one embodiment, the loading/unloading station 230 is configured to store scrub pads of different sizes thus, the apparatus 200 can also conveniently load different size probe card and different size scrub pad accordingly without shutting down the apparatus 200 to replace the scrub pad.

In one embodiment, the loading/unloading station 230 is configured to identify the types of scrub pad being stored at the loading/unloading station 230. This ability enables cleaning cycle recipe or parameter changes depending on the identified characteristics of the particular scrub pad. A suitable sensor may be installed at the station 230 to identify the scrub pad stored at the station 230. Each of the scrub pads may include an identification tag, print, barcode, or other suitable element to be sensed or detected by the particular sensor so that the characteristics of the scrub pad can be identified. Examples of a sensor that can be use include a capacitor sensor, an IR sensor, an RF sensor, a bar code sensor, or the like. Characteristics that can be determined include thickness, height, material, etc. These characteristics may dictate the setting for the particular cleaning cycles, such as how high to raise the scrub pad mounting plate 210 or how long before the scrub pad needs replacement. The ability to determine the characteristic of the scrub pad may allow accurate measurement for the thickness of the scrub pad that is loaded onto the scrub pad mounting plate 210.

In one embodiment, the loading/unloading station 230 is mounted on a track 218 that allows for the station 230 to be moved around. A motor (not shown) may be coupled to the apparatus 200 to control the movement of the station 230. The controller 221 can also be coupled to the motor, the station 230, or the track 218 to execute the movement of the station 230. In one embodiment, the station 230 is moved closed to the scrub pad mounting plate 210 for the loading and unloading of a scrub pad. In other embodiments, the base 204 moves the platform 202 and the scrub pad mounting plate 210 over to the station 230 for the loading and unloading of a scrub pad.

In one embodiment, the apparatus 200 includes a robotic assembly 234 with a handle 232. The robotic assembly 234 may be coupled to the station 230 and configured to move together with the station 230. Upon command, the robotic assembly 234 (via the handle 232) moves a scrub pad from the station 230 and loads it onto the scrub pad mounting plate 210. Similarly, the robotic assembly 234 also removes a scrub pad form the scrub pad mounting plate 210, places it into the station 230 and optionally, loads another scrub pad onto the scrub pad mounting plate 210. In one embodiment, the robotic assembly includes a motor (not shown) that allows it to move closer to the scrub pad mounting plate 210 to load and unload a scrub pad. Thus, both the scrub pad mounting plate 210 and the loading/unloading station 230 need not be moving for loading and unloading a scrub pad and only the robotic assembly 234 needs to move for such loading and unloading.

Each of the scrub pad 216A-216G can be similar to the scrub pad 300 previously described. In one embodiment, each scrub pad can include a chemical layer or layers or a gel-like material for a particular cleaning process. For example, the scrub pad can includes a well that includes a chemical layer for a cleaning process. FIGS. 3-4 illustrate an exemplary scrub pad 300 that can be used for such scrub pad 216A-216G. The scrub pad can also include one or more chemical layers or cells that may be acetic or basis which can oxidize, reduce, or clean contaminants, or which can induce a chemical reaction and/or a mechanical action that removes contaminants.

Figure 5:
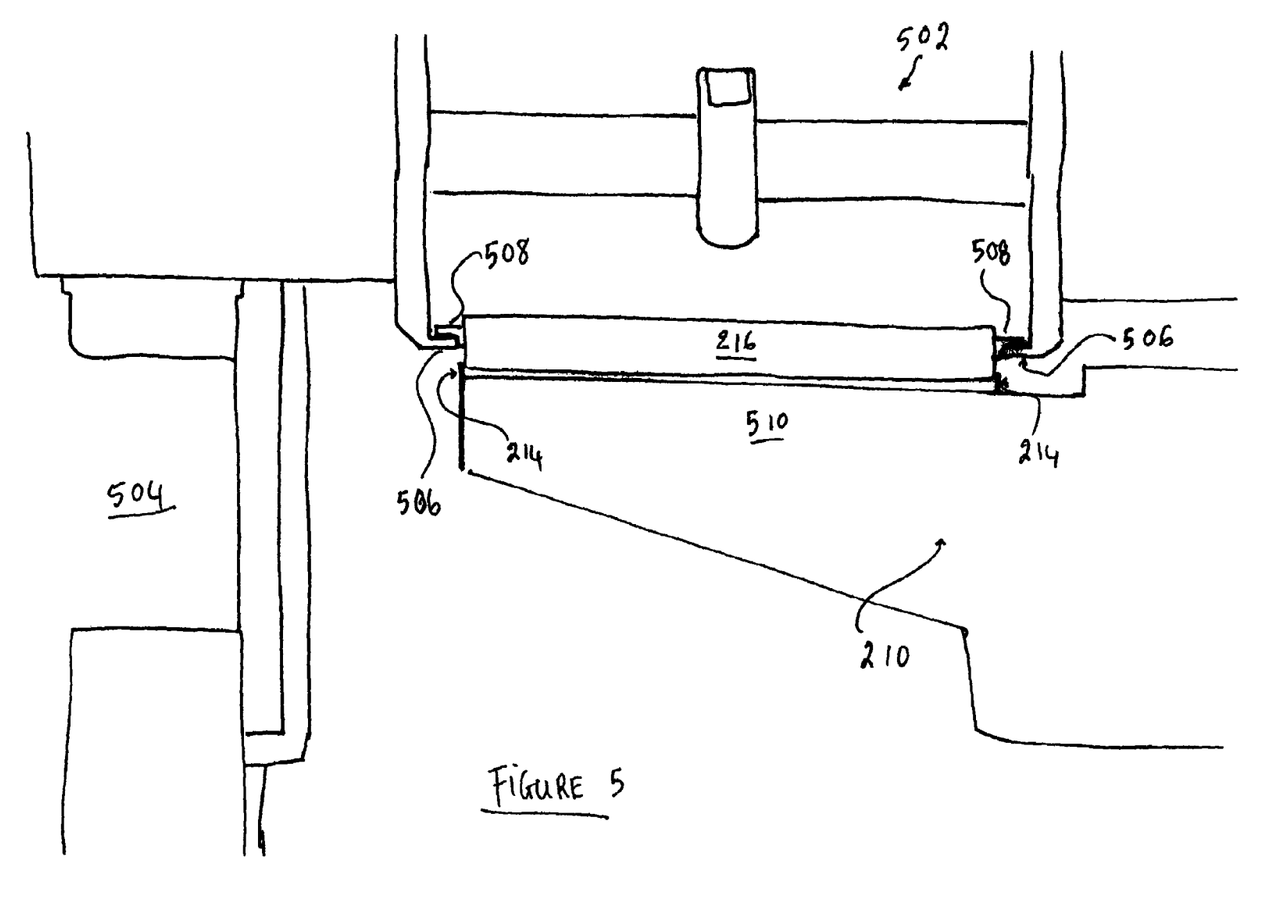
FIGS. 5-7 illustrate various views of an exemplary embodiment of a load/unload station for a scrub pad in according to embodiments of the present invention.
Figure 6:
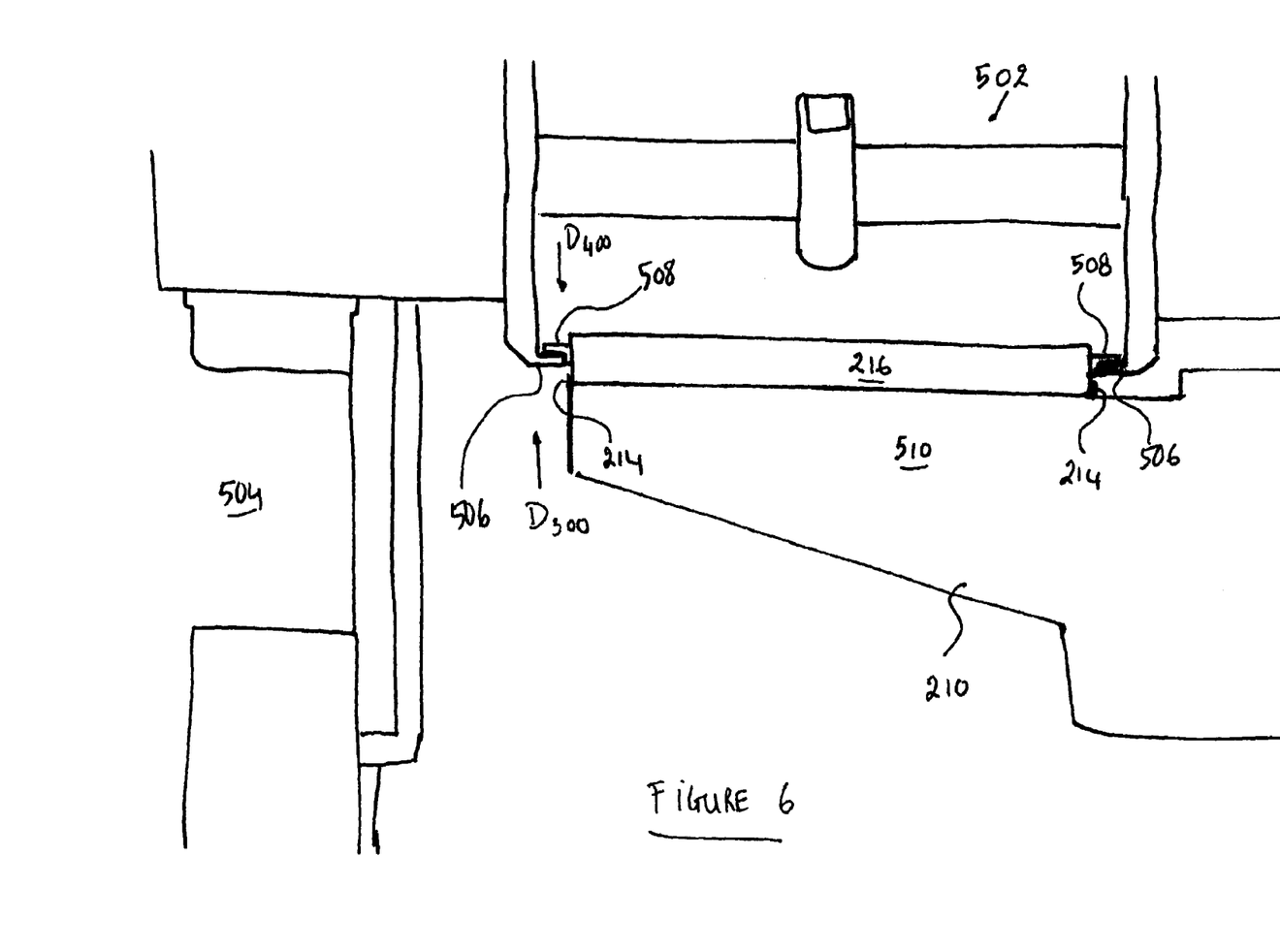
Figure 7:
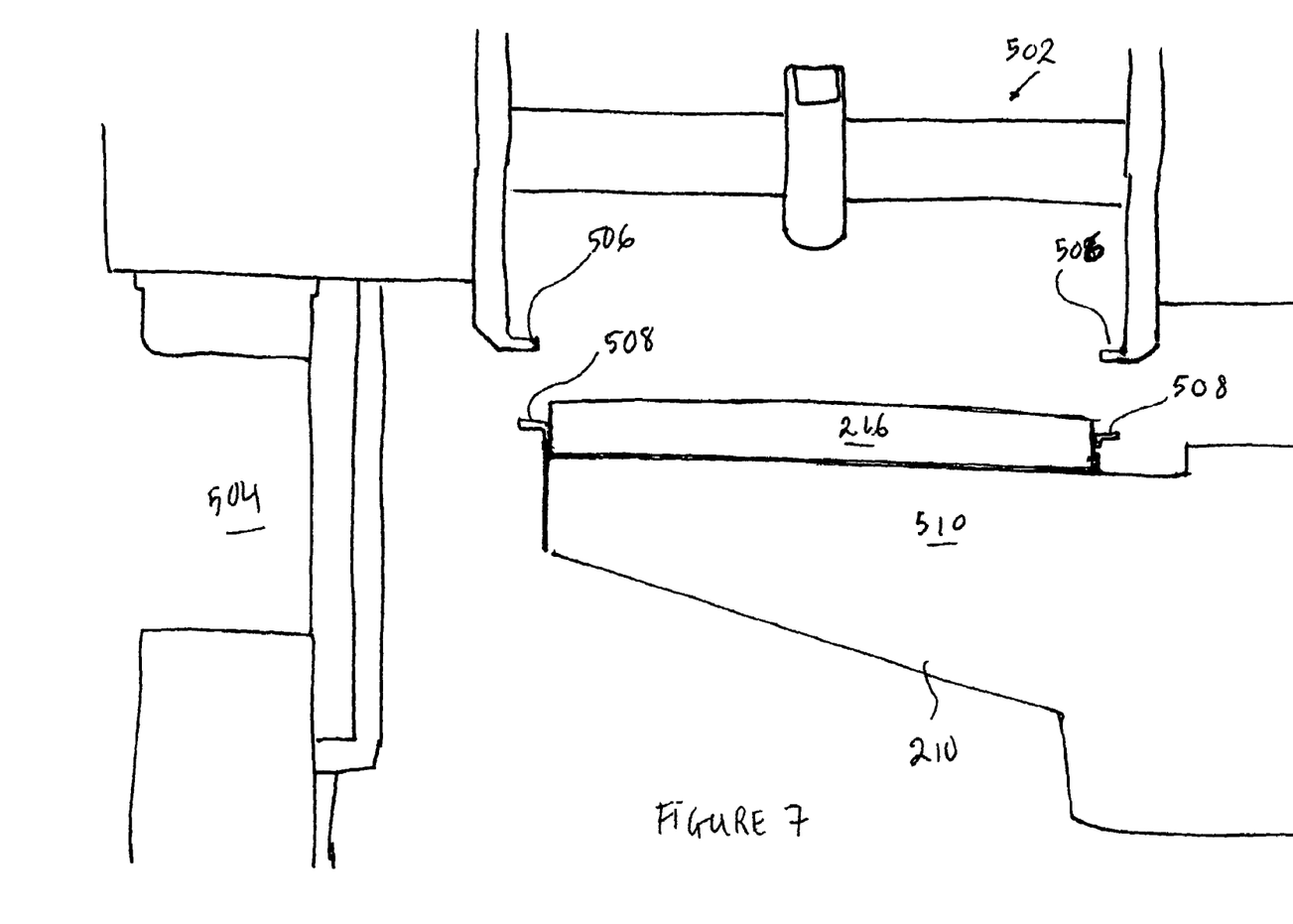

FIGS. 5-7 illustrate an exemplary configuration for the scrub pad mounting plate 210, a scrub pad 216, and a part of the loading/unloading station 230. It is to be understood that the station 230 can store more than scrub pad 216A-216B in form of a row, column, or any other suitable format. In FIG. 5, it is shown that the scrub pad 216 is mounted onto a handle 502 at the loading/unloading station 230. The handle 502 is configured to be able to move up and down in a vertical direction and in a horizontal direction. A motor 504 is coupled to the handle 502 to control the movement of the handle 502 for the loading and unloading of a scrub pad 216. The handle 502 includes a set of clips 506 which are used to anchor a scrub pad thereto until unloading is required. The scrub pad 216 is configured to include complimentary features 508 that will allow it to hook or engage the clips 506. As illustrated in FIG. 5, the handle 502 is aligned over a mounting portion 510 of the scrub pad mounting plate 210 where the scrub pad 216 is to be mounted. At the mounting station 510, coupling members 214 are included for securing the scrub pad 216 to the scrub pad mounting plate 210 as previously mentioned. In FIG. 5, the handle 502 is aligned over the mounting portion 510 of the scrub pad mounting plate 210 but the scrub pad 216 is still attached to the handle 502 and not yet loaded onto the scrub pad mounting plate 210.

Then, in FIG. 6, the handle 502 is moved vertically downward toward the mounting portion 510 so that the scrub pad 216 rests on the mounting portion 510. In one embodiment, the scrub pad mounting plate 210 is moved in the direction $D_{300}$ (upward) so as to lift the features 508 or the scrub pad up and causes them to disengage the clips 506. Then, to completely lift the scrub pad 216 off the handle 502 (FIG. 7), the scrub pad mounting plate 210 move to offset from the handle 502 allowing the clips 506 to completely disengage from the features 508. At this point, the scrub pad 216 is loaded onto the scrub pad mounting plate 210.

In an alternative embodiment, instead of having the scrub pad mounting plate 210 moves upward in the direction $D_{300}$ to disengage the scrub pad 216 from the handle 502, the handle 502 is moved downward in the direction $D_{400}$ to cause the clips 506 to disengage the features 508.

It is to be noted herein that although the apparatus 100 previously described does not show a loading/unloading station and a robotic assembly, it is to be understood that similar devices described for the apparatus 200 can be incorporated into the apparatus 100. Thus, the apparatus 100 can also include a loading/unloading station similar to the station 230 described and a robotic assembly 234 previously described.

Figure 8:
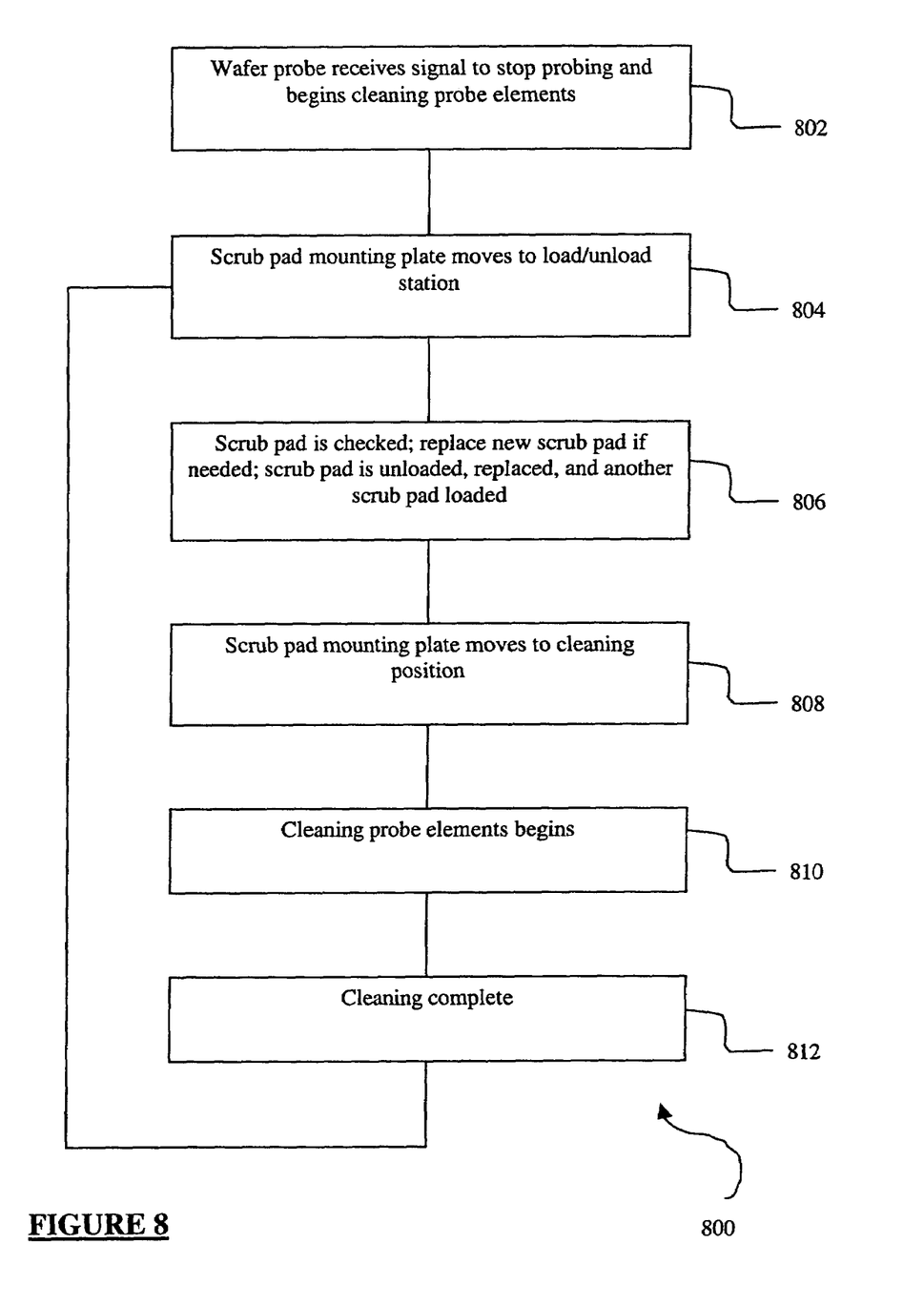
FIG. 8 illustrates an exemplary method according to some embodiments of the present invention.

FIG. 8 illustrates an exemplary method 800 of cleaning a probe element or probe elements of a probe card in according to embodiments of the present invention. At box 802, a wafer probe system receives a signal to stop probing and begins cleaning the probe elements. The wafer probe system can be one of the apparatuses previously described. The wafer probe system includes a scrub pad cleaning device in according to embodiments of the present invention.

At box 804, after the signal is received and the cleaning cycle begins, a scrub pad mounting plate moves to a loading/unloading station as previously described. Alternatively, the loading/unloading station moves to the scrub pad mounting plate. At box 806, determine if a scrub pad is already present on the scrub pad mounting plate. The scrub pad may be checked to see if replacement is needed. Additionally, the loading/unloading station also performs a check for characteristics of the scrub pad to be loaded onto the scrub pad mounting plate (characteristic determined). If there is a need for scrub pad replacement, the scrub pad is removed or unloaded from the scrub pad mounting plate. An appropriate scrub pad is mounted onto the scrub pad mounting plate.

At box 808, the scrub pad mounting plate moves into a cleaning position and is aligned with a probe card. In one embodiment, the scrub pad is positioned below the probe card. At box 810, the probe elements are cleaned. At box 812, probe element cleaning is completed. In one embodiment, the scrub pad mounting plate moves to the loading/unloading station to replace the scrub pad. Another cleaning cycle may begin as described.

In one embodiment, the exemplary apparatuses of the present invention performs a method that comprises placing a scrub pad on a scrub pad mounting plate, positioning the scrub pad with respect to a probe card having at least one probe element to be cleaned, and cleaning the probe element. Next, the method further comprises receiving a signal to stop cleaning the probe element, moving the scrub pad away from the probe card, and moving the scrub pad mounting plate to a load/unload station. Then, the scrub pad is unloaded at the loading/unloading station. The method may further comprise loading another scrub pad onto the scrub pad mounting plate. Prior to loading the scrub pad, at least one characteristic of the scrub pad or other scrub pads stored at the loading/unloading station is analyzed. Based on the characteristic determined, the method further comprises programming or modifying at least one parameter for a cleaning cycle for the probe card based on the analysis.

In one embodiment, the exemplary apparatuses of the present invention performs a method that comprises placing a substrate (e.g., a silicon wafer) on a substrate supporter provided in a cleaning chamber and placing a scrub pad on a scrub pad mounting plate provided in the cleaning chamber. The scrub pad mounting plate and the substrate supporter are coupled to a chuck provided in the cleaning chamber, wherein the chuck is configured to move the substrate supporter and the scrub pad mounting plate and wherein the scrub pad when placed on the scrub pad mounting plate is higher than a substrate placed on the substrate supporter. The method further comprises providing a probe card having at least one probe element configured to perform a testing procedure on the substrate. The probe card then performs a particular testing desired for the substrate.

Next, a scrub pad is loaded onto the scrub pad mounting plate from a load/unload station configured to store the scrub pad. The scrub pad mounting plate can be moved over to the load/unload station for loading of the scrub pad onto the scrub pad mounting plate. Alternatively, the load/unload station is moved to the scrub pad mounting plate for loading of the scrub pad onto the scrub pad mounting plate. To begin cleaning the probe card, the scrub pad is positioned with respect to the probe card for the cleaning of the probe element(s). When cleaning is completed, the scrub pad and the scrub pad mounting plate are moved away from the probe card. The scrub pad mounting plate is moved to a load/unload station for unloading of the scrub pad at the load/unload station. In one embodiment, another scrub pad is loaded onto the scrub pad mounting plate.

In one embodiment, prior to cleaning, at least one characteristic of the scrub pad is analyzed at the load/unload station. At least one parameter for a cleaning cycle for cleaning the probe element is modified or programmed based on the analysis. The characteristics that can be analyzed includes at least scrub pad thickness, scrub pad chemical components, scrub pad material, and scrub pad identification.

In one embodiment, a processing unit or a controller configured to execute a set of instructions that can carry out the method is coupled to the apparatus used to clean the probe card. As previously mentioned, cleaning the probe element includes at least scrubbing, cleaning, servicing, maintaining, reshaping, sharpening, and modifying the probe element.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

We claim:

1. A cleaning device comprising:
   a substrate supporter for supporting a substrate to be cleaned;
   a scrub pad mounting plate;
   a chuck coupling to said substrate supporter and said scrub pad mounting plate, said chuck configured to move said substrate supporter and said scrub pad mounting plate;
   a scrub pad load/unload station configured to hold said scrub pad, wherein said scrub pad load/unload station further comprises a robotic element configured to perform at least one of holding said scrub pad, holding multiples of said scrub pads, moving said scrub pad to and from said load/unload station, unloading said scrub pad from said scrub pad mounting plate, loading said scrub pad onto said scrub pad mounting plate, treating said scrub pad, and identifying one or more characteristics of said scrub pad; and
   a scrub pad mountable to and moveable from said scrub pad mounting plate, wherein said scrub pad, when mounted to said scrub pad mounting plate, is higher than said substrate when mounted on said substrate supporter.

2. A cleaning device comprising:
   a substrate supporter for supporting a substrate to be cleaned;
   a scrub pad mounting plate;
   a chuck coupling to said substrate supporter and said scrub pad mounting plate, said chuck configured to move said substrate supporter and said scrub pad mounting plate;
   a scrub pad load/unload station configured to hold said scrub pad, wherein said scrub pad load/unload station is configured to perform at least one of holding said scrub pad, holding multiples of said scrub pads, moving said scrub pad to and from said load/unload station, unloading said scrub pad from said scrub pad mounting plate, loading said scrub pad onto said scrub pad mounting plate, treating said scrub pad, and identifying one or more characteristics of said scrub pad; and
   a scrub pad mountable to and moveable from said scrub pad mounting plate, wherein said scrub pad, when mounted to said scrub pad mounting plate, is higher than said substrate when mounted on said substrate supporter.

3. A cleaning device comprising:
   a substrate supporter for supporting a substrate to be cleaned;
   a scrub pad mounting plate;
   a chuck coupling to said substrate supporter and said scrub pad mounting plate, said chuck configured to move said substrate supporter and said scrub pad mounting plate;
   a scrub pad mountable to and moveable from said scrub pad mounting plate, wherein said scrub pad, when mounted to said scrub pad mounting plate, is higher than said substrate when mounted on said substrate supporter;
   a probe card having a plurality of probe elements extending therefrom, wherein said probe elements are configured to test at least one aspect of said substrate; and
   a camera, said camera configured to align said substrate supporter and said scrub pad mounting plate with respect to said probe card.

4. A method comprising:
   placing a scrub pad on a scrub pad mounting plate, said scrub pad mounting plate coupling to a chuck which is further coupled to a substrate supporter for supporting a substrate, wherein said chuck is configured to move said substrate supporter and said scrub pad mounting plate, and wherein said scrub pad when placed on said scrub pad mounting plate is higher than a substrate placed on said substrate supporter;
   positioning said scrub pad with respect to a probe card having at least one probe element to be cleaned;
   cleaning said at least one probe element
   receiving a signal to stop cleaning said probe element;
   moving said scrub pad away from said probe card;
   moving said scrub pad mounting plate to a load/unload station; and
   unloading said scrub pad at said load/unload station.

5. The method of claim 4 further comprising:
   loading another scrub pad onto said scrub pad mounting plate.

6. The method of claim 4 further comprising:
   analyzing at least one characteristic of said scrub pad or other scrub pads stored at said load/unload station.

7. The method of claim 6 further comprising:
   programming or modifying at least one parameter for a cleaning cycle for said probe card based on said analyzing.

8. A. method comprising:
   placing a substrate on a substrate supporter provided in a cleaning chamber;
   placing a scrub pad on a scrub pad mounting plate provided in said cleaning chamber;
   wherein said scrub pad mounting plate and said substrate supporter are coupled to a chuck provided in said cleaning chamber, wherein said chuck is configured to move said substrate supporter and said scrub pad mounting plate,
   wherein said scrub pad when placed on said scrub pad mounting plate is higher than a substrate placed on said substrate supporter;

providing a probe card having at least one probe element configured to perform a testing procedure on said substrate; and wherein placing said scrub pad on said scrub pad mounting plate further comprises loading said scrub pad onto said scrub pad mounting plate from a load/unload station configured to store said scrub pad.

9. The method of claim 8 further comprising:

moving said scrub pad mounting plate over to said load/unload station for loading of said scrub pad onto said scrub pad mounting plate.

10. The method of claim 8 further comprising:

moving said load/unload station to said scrub pad mounting plate for loading of said scrub pad onto said scrub pad mounting plate.

11. A method comprising:

placing a substrate on a substrate supporter provided in a cleaning chamber;

placing a scrub pad on a scrub pad mounting plate provided in said cleaning chamber;

wherein said scrub pad mounting plate and said substrate supporter are coupled to a chuck provided in said cleaning chamber, wherein said chuck is configured to move said substrate supporter and said scrub pad mounting plate, wherein said scrub pad when placed on said scrub pad mounting plate is higher than a substrate placed on said substrate supporter;

providing a probe card having at least one probe element configured to perform a testing procedure on said substrate;

positioning said substrate with respect to said probe card;

performing a testing procedure for devices formed in or on said substrate using said probe card;

receiving a signal to stop said testing procedure;

receiving signal for cleaning said at least one probe element;

positioning said scrub pad with respect to said probe card for said cleaning of said at least one probe element;

cleaning said at least one probe element using said scrub pad receiving a signal to stop cleaning said at least one probe element;

moving said scrub pad away from said probe card;

moving said scrub pad mounting plate to a load/unload station; and unloading said scrub pad at said load/unload station.

12. The method of claim 11 further comprising:

loading another scrub pad onto said scrub pad mounting plate.

13. A method comprising:

placing a substrate on a substrate supporter provided in a cleaning chamber;

placing a scrub pad on a scrub pad mounting plate provided in said cleaning chamber;

wherein said scrub pad mounting plate and said substrate supporter are coupled to a chuck provided in said cleaning chamber, wherein said chuck is configured to move said substrate supporter and said scrub pad mounting plate, wherein said scrub pad when placed on said scrub pad mounting plate is higher than a substrate placed on said substrate supporter;

providing a probe card having at least one probe element configured to perform a testing procedure on said substrate;

positioning said substrate with respect to said probe card;

performing a testing procedure for devices formed in or on said substrate using said probe card;

receiving a signal to stop said testing procedure;

receiving signal for cleaning said at least one probe element;

positioning said scrub pad with respect to said probe card for said cleaning of said at least one probe element;

cleaning said at least one probe element using said scrub pad; wherein said cleaning said at least one probe element using said scrub pad further comprising:

analyzing at least one characteristic of said scrub pad at said load/unload station; and programming or modifying at least one parameter for a cleaning cycle for cleaning said at least one probe element based on said analyzing.

14. The method of claim 13 wherein said at least one characteristic includes any one of scrub pad thickness, scrub pad chemical components, scrub pad material, and scrub pad identification.

* * * * *